United States Patent [19]

Murata et al.

[11] Patent Number: 5,405,447
[45] Date of Patent: Apr. 11, 1995

[54] PLASMA CVD APPARATUS

[75] Inventors: Masayoshi Murata; Yoshiaki Takeuchi; Masaru Kodama; Satoshi Uchida; Kazutoshi Hamamoto, all of Nagasaki, Japan

[73] Assignee: Mitsubishi Jukogyo Kabushiki Kaisha, Tokyo, Japan

[21] Appl. No.: 74,738

[22] Filed: Jun. 10, 1993

Related U.S. Application Data

[63] Continuation of Ser. No. 694,402, May 1, 1991, abandoned.

[30] Foreign Application Priority Data

May 15, 1990 [JP] Japan .................. 2-123200

[51] Int. Cl.6 ............................................. C23C 16/50
[52] U.S. Cl. .............................................. 118/723 E
[58] Field of Search .................................. 118/723 E

[56] References Cited

U.S. PATENT DOCUMENTS

| | | | |
|---|---|---|---|
| 4,526,673 | 7/1985 | Little et al. | 204/192 |
| 4,960,072 | 10/1990 | Ohta | 118/723 |
| 5,039,376 | 8/1991 | Zukotynski | 118/723 |

FOREIGN PATENT DOCUMENTS

| | | | |
|---|---|---|---|
| 0244842 | 11/1987 | European Pat. Off. | |
| 3830430A1 | 3/1989 | Germany. | |
| 59-145780 | 8/1984 | Japan | 118/733 |
| 62-263236 | 11/1987 | Japan. | |
| 63-176461 | 7/1988 | Japan | 118/730 |
| 1-181513 | 7/1989 | Japan | 118/723 |
| 9114798 | 10/1991 | WIPO | 118/724 |

OTHER PUBLICATIONS

Bunshah, Deposition Technologies for Films and Coatings, Noyes Publications, Park Ridge, N.J., USA, pp. 258–259.

*Primary Examiner*—Richard Bueker
*Attorney, Agent, or Firm*—Jacobson, Price, Holman & Stern

[57] ABSTRACT

A plasma CVD apparatus whose discharge electrode is a single line member bent in a U shape in an alternating manner and in which a substrate to be processed is held substantially in parallel to the discharge electrode. The electric field around the electrode becomes stronger and the intensity distribution of this field becomes even. As a result, a product film formed on the substrate surface has a uniform thickness, and the film can be formed at high speeds.

2 Claims, 5 Drawing Sheets

DISTANCE BETWEEN NEIGHBORING LINES

PLASMA CVD APPARATUS

This is a continuation of application Ser. No. 07/694,402, filed May 1, 1991, now abandoned.

BACKGROUND OF THE INVENTION

1. Field of the Invention

This invention relates to a plasma CVD (chemical vapor deposition) apparatus suitable for the manufacture of thin films of large areas which are used in various electronic devices, such as amorphous silicon solar cells, thin film semiconductors, optical censors, and protective films for semiconductors.

2. Description of the Related Art

With reference to FIG. 7, we shall describe a conventional plasma CVD apparatus which has been used for the manufacture of thin amorphous silicon films with large areas. This technology is known as disclosed, for example, in Japanese patent application No. 106314/1986 (61-106314).

Electrodes 2, 3 are disposed in parallel with each other in a reaction container 1 for generating glow discharge plasma. Electric power with a commercial frequency of, for example, 60 Hz is supplied to these electrodes 2, 3 from a low-frequency power supply 4. A DC or high-frequency power supply can also be used. A coil 5 is wound around the reaction container 1, and AC power is supplied from an AC power supply 6. A gas mixture of, for example, monosilane and argon is supplied to the reaction container 1 from a cylinder (not shown) via a reaction gas introduction pipe 7. The gas in the reaction container 1 is exhausted through an exhaust pipe 8 by a vacuum pump 9. A substrate 10 is located outside the discharge space formed by the electrodes 2, 3 and supported in the direction perpendicular to the faces of the electrodes 2, 3 by a suitable means.

Using this apparatus, a thin film can be manufactured in the following manner. The vacuum pump 9 is driven to remove gas from the reaction container 1. Through reaction gas introduction pipe 7, a gas mixture of, for example, monosilane and argon is supplied. The pressure inside the reaction container 1 is maintained at 0.05 to 0.5 Torr, and electric voltage is applied to the electrodes 2, 3 from the low-frequency power supply 4. Glow discharge plasma is generated. An AC voltage of, for example, 100 Hz is applied to the coil 5 to generate a magnetic field B in the direction perpendicular to the electric field E generated between the electrodes 2 and 3. The magnetic flux density in this magnetic field can be about 10 gausses.

Of the gas supplied from the reaction gas introduction pipe 7, monosilane gas is decomposed by the glow discharge plasma generated between the electrodes 2 and 3. As a result, silicon (Si) radicals occur and attach to the surface of the substrate 10 to form a thin film.

Charged particles, such as argon ions, take the so-called E·B drift motion because of the Coulombic force $F_1 = q \cdot E$ and the Lorentz force $F_2 = q(V \cdot B)$, where V is the velocity of a charged particle. The charged particles are given an initial velocity by this E·B drift and fly in the direction perpendicular to the electrodes 2, 3 toward the substrate 10. However, in the discharge space where the effect of the electric field between the electrodes 2 and 3 is small, the charged particles fly following a Larmor trajectory because of the cyclotron motion due to the magnetic field B generated by the coil 5. Therefore, the charged particles, such as argon ions, rarely hit the substrate 10 directly.

The silicon (Si) radicals, which are electrically neutral, are not influenced by the magnetic field B and divert from the above trajectory of the charged particles to reach the substrate 10 and form a thin amorphous film on the surface thereof. Because the Si radicals collide with the charged particles flying along the Larmor trajectory, the thin amorphous film is formed not only in front of the electrodes 2, 3, but also in areas to the left and the right thereof. Furthermore, because the magnetic field B is varied by the AC power supply 6, the thin amorphous film can be formed on the surface of the substrate 10 uniformly. Also, because the electrodes 2, 3 can be long as long as they fit inside the reaction container 1, even if the substrate 10 is long, the thin amorphous film can be formed uniformly on its surface.

According to the conventional apparatus described above, a film can easily be formed on a large area by generating a magnetic field B in the direction perpendicular to the discharge electric field E between the electrodes generating glow discharge plasma. However, this apparatus has the following problems.

(1) When a film of large area is formed, the electrodes need to be long. In order to generate stable plasma using long electrodes, the frequency of the power supply should be as small as possible. A power supply with a frequency of several 10 to several 100 Hz is therefore used. However, under the conditions in which the frequency becomes small and the ion transport during a half period exceeds the distance between the electrodes, secondary electrons discharged from the negative electrode (cathode) due to collisions between the ions play an essential role in maintaining the plasma in the same way as in DC discharge. Therefore, if a film forms on the electrodes and the electrodes become insulated by the film, discharge does not take place in the insulated portion. In this case, the electrode surfaces have to be kept always clean. Therefore, troublesome operations, such as exchanging and cleaning the electrodes very often, are required, and it is a reason for higher costs.

(2) If a high-frequency plasma source of, for example, 13.56 MHz is used in order to alleviate the above disadvantage (1), the secondary electrons discharged from the electrode become inessential in the maintenance of the discharge. Then, even if there exists some insulator, such as a film, on the electrode, glow discharge still forms between the electrodes. However, if the electrodes used are long, because of the skin effect of high frequency, most of the electric current flows in the surface (about 0.01 mm) and thus the electric resistance increases. For example, if the length of the electrode is 1 m or more, some potential distribution appears on the electrodes and uniform plasma does not result. If we consider this in terms of a distribution constant circuit, it can be shown as in FIG. 8. In FIG. 8, x indicates the distance in the length direction of the electrode. If the resistance R per unit length of the electrode is so large that it cannot be ignored compared with the impedance $Z_1, Z_2, \ldots, Z_n$ of the discharge portion, a potential distribution appears in the electrode. Therefore, when a high-frequency power supply is used, it is very difficult and has not been possible in practical applications to form a film having a large area.

(3) According to the methods (1) and (2) above, when a thin amorphous silicon film of 50 cm × 50 cm or larger is produced, it has been extremely difficult to keep the distribution of film thickness within ±10% and maintain the speed of film formation at 1 Å/sec or more.

SUMMARY OF THE INVENTION

In a plasma CVD apparatus which comprises a reaction container, a means for introducing a reaction gas into the reaction container and for discharging the reaction gas therefrom, discharge electrodes disposed in the reaction container, a power supply for providing the discharge electrodes with electric power for glow discharge, so that a thin amorphous film can be formed on a surface of a substrate positioned in the reaction container, the plasma CVD apparatus of this invention is characterized in that the discharge electrodes are formed by a planar coil electrode made by bending a single line member in a U shape in an alternating manner, and that the substrate is held substantially in parallel with the discharge electrode.

In this invention, a power source which supplies electric power for glow discharge to the discharge electrode preferably has a high frequency of, for example, 13.56 MHz.

In this invention, the distance between the neighboring line elements in the zigzaging planar coil electrode should preferably be 50 mm or less. If this distance exceeds 50 mm, the distribution of film thickness of amorphous silicon formed on the substrate surface becomes ±30% or more, and this is not desirable.

In this invention, it is preferred to dispose an impedance matching circuit comprising coils and condensers between the power supply and the zigzaging planar coil electrode when supplying the electrode with electric power for generating plasma.

In this invention, it is preferred to dispose a coil for generating a magnetic field B in the direction perpendicular to the electric field E generated between the electrode elements, so that the coil surrounds the discharge electrode, as well as a power source supplying the coil with electric current for generating the magnetic field, so that the magnetic field shakes the plasma. It is not necessarily required, however, to shake the plasma by the magnetic field.

In this invention, instead of a plurality of the conventional parallel planar electrodes, a zigzaging planar coil electrode which is formed by bending a single line member in a U shape in an alternating manner is disposed in the reaction container, so that the electric field around the electrode becomes stronger and the intensity distribution of this field becomes even. For example, when SiH4 gas is used as a reaction gas, SiH light emission intensity (light emission at a wave length of 414 nm) becomes uniform. Therefore, the amorphous silicon film formed on the substrate surface has substantially uniform thickness, and the film can be formed at high speeds. Therefore, the plasma CVD apparatus of this invention is suitable for the production of a thin amorphous film which is large in area. Because the zigzaging planar coil electrode is a kind of antenna, its length l should satisfy the following relation with respect to the wavelength λ for the frequency of the power supply:

$l < \lambda/4.$

BRIEF DESCRIPTION OF THE DRAWING(S)

DETAILED DESCRIPTION OF THE PREFERRED EMBODIMENT

An embodiment of this invention will be described with reference to the drawings.

Figure 1:
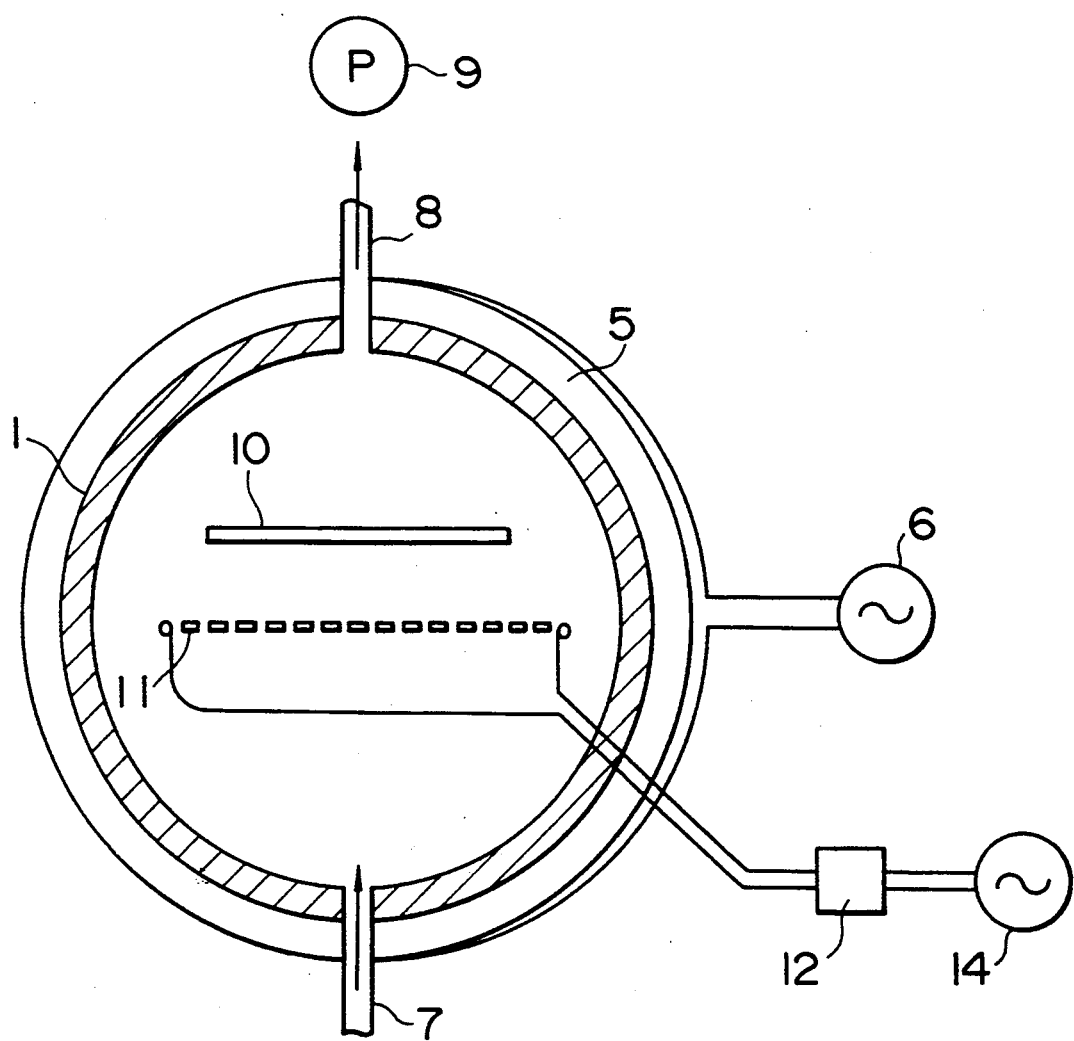
FIG. 1 is a cross sectional view showing the structure of the plasma CVD apparatus in the embodiment of this invention.
Figure 2:
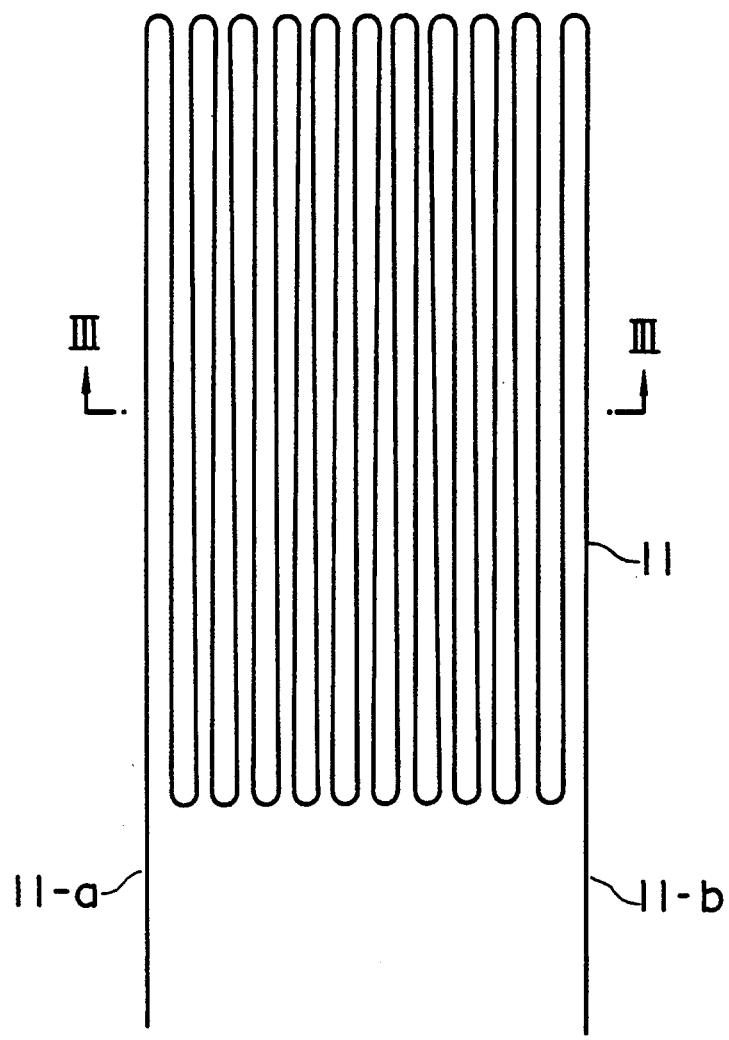
FIG. 2 is a plan view of the zigzaging planar coil electrode being used in the above plasma CVD apparatus.
Figure 3:
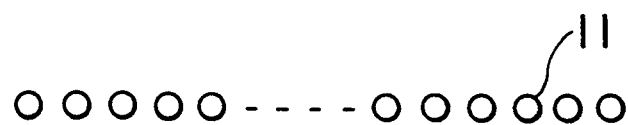
FIG. 3 is a cross sectional view taken along the III—III line in FIG. 2.
Figure 4:
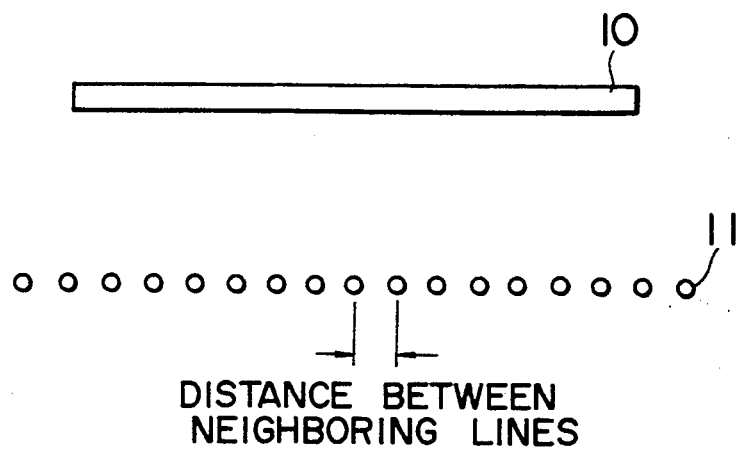
FIG. 4 is a diagram showing the arrangement of the electrode and the substrate in the above plasma CVD apparatus.
Figure 7:
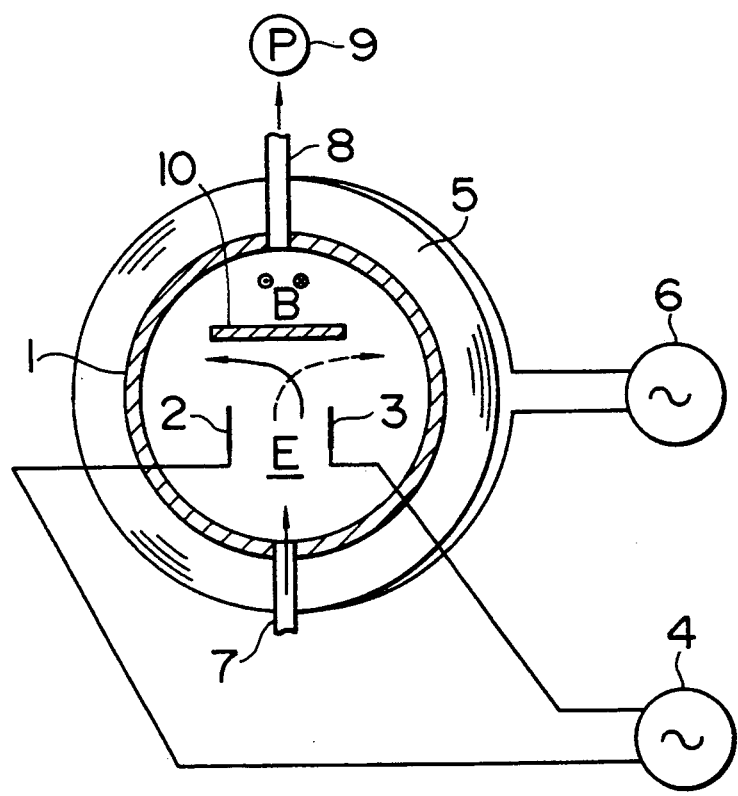
FIG. 7 is a cross sectional view showing the structure of a conventional plasma CVD apparatus.
Figure 8:
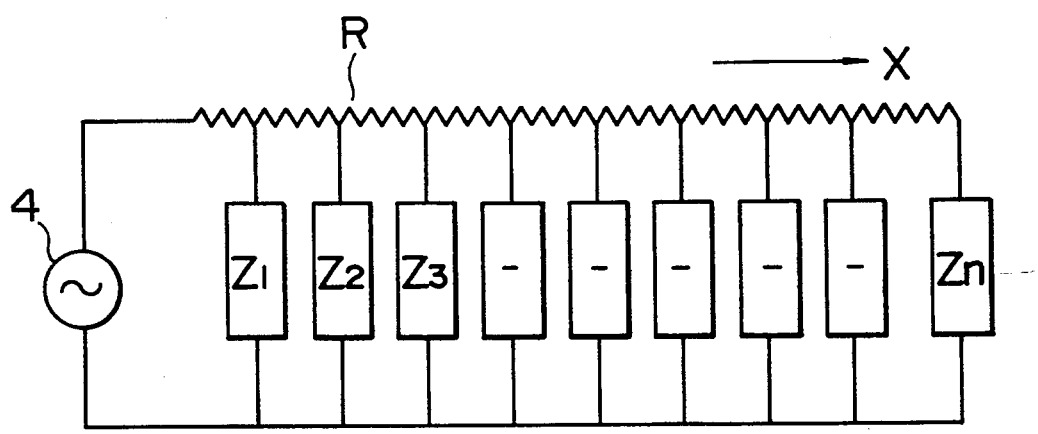
FIG. 8 is for explaining problems associated with the conventional plasma CVD apparatus.

FIG. 1 is a cross section showing the structure of an embodiment of the plasma CVD apparatus of this invention. The same parts as in FIG. 7 are marked by the same reference numerals. A zigzaging planar coil electrode 11 is disposed in the reaction container 1 for generating glow discharge plasma. This zigzaging planar coil electrode 11 has, as shown in FIGS. 2 and 3, a structure which is obtained by bending a single line member to form a compressed spring shape with adjacent turns substantially parallel one another. Power with a frequency of, for example, 13.56 MHz is supplied to power supply points 11a, 11b on the zigzaging planar coil electrode 11 via an impedance matching circuit 12. A coil 5 is disposed around the reaction container 1, and electric power is supplied to the coil from an AC power supply 6. Also, this power supply can be a DC source. In this embodiment, a magnetic field of 50 to 120 gausses is generated by the coil 5. From a cylinder (not shown) a gas mixture of, for example, monosilane and argon is supplied to the reaction container 1 through a reaction gas introduction pipe 7. The gas present in the reaction container 1 is exhausted by a vacuum pump 9 through an exhaust pipe 8. The substrate 10 is placed in parallel with the zigzaging planar coil electrode 11 and supported by a substrate holder not shown in the drawings.

Figure 5:
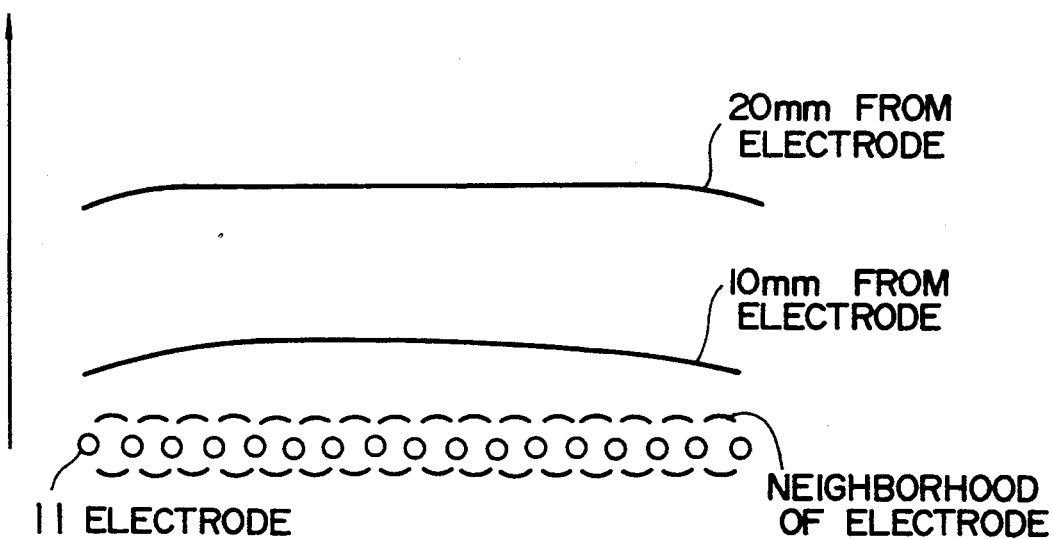
FIG. 5 is a descriptive drawing showing SiH emission intensity distribution near the electrode in the embodiment of this invention.

Using this apparatus, a thin film is produced according to the following procedure. The gas in the reaction container 1 is exhausted by operating the vacuum pump 9. A gas mixture of, for example, monosilane and argon is supplied at rates of 100 to 200 cm³/min through the reaction gas introduction pipe 7. The pressure inside the reaction container 1 is maintained to 0.05 to 0.5 Torr, and electric voltage is applied to the zigzaging planar coil electrode 11 from the high-frequency power supply 14 through the impedance matching circuit 12. Then glow discharge plasma appears around the electrode 11. The light emission is observed through an optical filter which let pass the light having a wavelength of about 414 nm only. Results such as shown in FIG. 5 are obtained. The emission intensity is more or less constant between the electrode 11 and the substrate 10. From this finding, the distribution of film thickness of a thin amorphous silicon film attaching to the surface of the substrate 10 is inferred to be uniform.

The distribution of film thickness of the thin amorphous silicon film depends on the flow rate of the reaction gas, pressure, the concentration of SiH$_4$, and electric power as well as on the distance between the neighboring line elements in the zigzaging planar coil electrode 11. Experiments for film formation were carried out under the following conditions.

Substrate material: glass
Substrate area: 50 cm×50 cm
Kind of reaction gas: hydrogen-diluted 20% SiH$_4$
Reaction gas flow rate: 100 cm$^3$/min
Reaction container pressure: 0.3 Torr
High-frequency electric power: 150 W The distance between the neighboring line elements in the zigzaging planar coil electrode 11 was set between 5 mm and 45 mm. Then thin films with an average thickness of 5000 Å were formed. The relation between the distance between the neighboring line elements and the distribution of film thickness is shown in FIG. 6.

Figure 6:
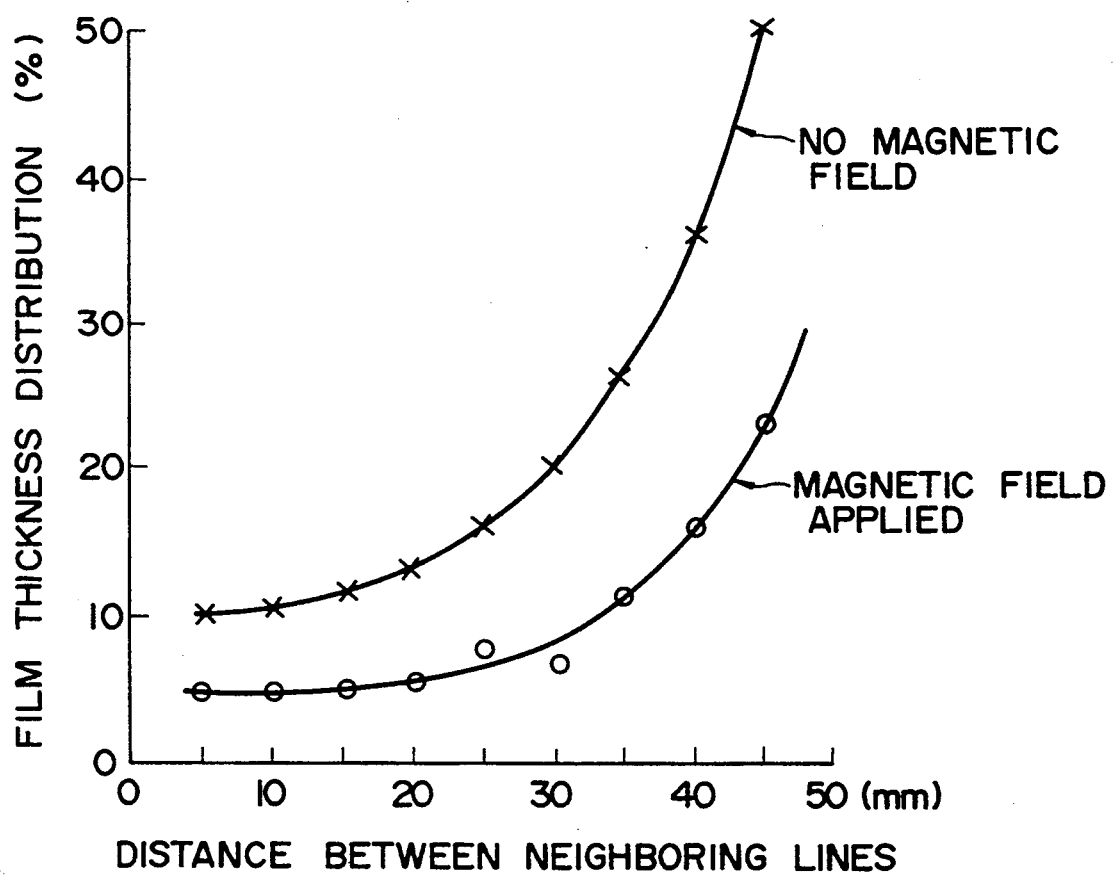
FIG. 6 is a graph showing the relation between the distance between the neighboring line elements in the zigzaging planar coil electrode and the film thickness distribution of amorphous silicon.

As shown in FIG. 6, if no magnetic field is applied, the film thickness distribution was ±20% or less when the distance between the line elements was 30 mm or less. On the other hand, when an alternating magnetic field (a sinusoidal wave of 10 Hz frequency) of ±80 gausses was applied, the film thickness distribution turned out to be better compared to the cases with no magnetic field.

According to this embodiment, the zigzaging planar coil electrode 11 is used as a discharge electrode, and high-frequency power supply of 13.56 MHz is used as a power supply for generating plasma, and a magnetic field is applied in the direction perpendicular to the electric field, so that amorphous silicon films with a large area can be produced with such a high speed as 3 to 5 Å/sec.

As we have described in the above, according to this invention, by using a zigzaging planar coil electrode as the discharge electrode, the electric field intensity in the neighborhood of the electrode becomes stronger and more uniform, and thus thin films of amorphous silicon having large areas can be produced with high speed. Therefore, this invention is industrially useful and valuable in the manufacture of, for example, amorphous silicon solar cells, thin film semiconductors, optical sensors, and protective layers for semiconductors.

We claim:

1. In a plasma CVD apparatus which comprises a reaction container, a means for introducing a reaction gas into the reaction container and for discharging the reaction gas therefrom, discharge electrode means disposed in the reaction container, and a power supply for providing the discharge electrode means with electric power for glow discharge, so that a thin amorphous film can be formed on a surface of a substrate positioned in the reaction container, the improvement in which the discharge electrode means comprises a single compressed spring shape element formed by bending a single linear electrode element having opposite ends in a tight zig-zag pattern with adjacent turns being substantially parallel one another, voltage for plasma generation being applied at said opposite ends of said element.

2. In a plasma CVD apparatus which comprises a reaction container, a means for introducing a reaction gas into the reaction container and for discharging the reaction gas therefrom, discharge electrode means disposed in the reaction container, and a power supply for providing the discharge electrode means with electric power for glow discharge, so that a thin amorphous film can be formed on a surface of a substrate positioned in the reaction container, the improvement in which the discharge electrode means comprises a compressed spring shape element formed by bending a single linear electrode element having opposite ends in a tight zig-zag pattern with adjacent turns being substantially parallel one another, voltage for plasma generation being applied at said opposite ends of said element; and the substrate being held substantially in parallel with the discharge means.

* * * * *